US010382005B2

(12) United States Patent
Gardner

(10) Patent No.: US 10,382,005 B2
(45) Date of Patent: Aug. 13, 2019

(54) COMMUNICATIONS SYSTEM USING HYBRID COMMON MODE CHOKE AND KELVIN SENSING OF VOLTAGE

(71) Applicant: Linear Technology Corporation, Milpitas, CA (US)

(72) Inventor: Andrew J. Gardner, Santa Barbara, CA (US)

(73) Assignee: Linear Technology Corporation, Milpitas, CA (US)

( * ) Notice: Subject to any disclaimer, the term of this patent is extended or adjusted under 35 U.S.C. 154(b) by 115 days.

(21) Appl. No.: 15/653,170

(22) Filed: Jul. 18, 2017

(65) Prior Publication Data
US 2018/0026525 A1 Jan. 25, 2018

Related U.S. Application Data

(60) Provisional application No. 62/366,308, filed on Jul. 25, 2016, provisional application No. 62/458,522, filed on Feb. 13, 2017.

(51) Int. Cl.
*H03H 7/42* (2006.01)
*H03H 1/00* (2006.01)
(Continued)

(52) U.S. Cl.
CPC .............. *H03H 7/427* (2013.01); *H02M 1/44* (2013.01); *H03H 1/0007* (2013.01);
(Continued)

(58) Field of Classification Search
CPC .. H02M 1/44; H04L 25/0298; H04L 25/0272; H04L 12/40045; H04L 12/10; H03H 7/427; H03H 7/0138; H03H 1/0007
(Continued)

(56) References Cited

U.S. PATENT DOCUMENTS 6,492,880 B1 12/2002 Chiappe et al.
6,804,351 B1 10/2004 Karam
(Continued)

FOREIGN PATENT DOCUMENTS

WO 2005025064 A2 3/2005

OTHER PUBLICATIONS

Gardner, "Potential Issues with the D1.0 Class Table", Linear Technology Corporation internal document, May 15, 2015.
(Continued)

*Primary Examiner* — Rakesh B Patel
*Assistant Examiner* — Jorge L Salazar, Jr.
(74) *Attorney, Agent, or Firm* — Patent Law Group LLP; Brian D. Ogonowsky

(57) ABSTRACT

In a communications system that conducts differential data via a pair of wires, AC common mode noise is undesirably coupled to the wires in a noisy environment. A hybrid common mode choke (HCMC) attenuates the AC common mode noise while passing the differential data to a PHY. The HCMC includes a CMC (windings with the same polarity) and a differential mode choke (windings with opposite polarities). The CMC attenuates the AC common mode noise, and the DMC passes the attenuated AC common mode noise to termination circuitry to eliminate it. Also disclosed is a technique for Kelvin sensing the DC voltage at the pair of wires, in a PoDL system, by detecting the voltage on wires that do not carry DC current, so as to provide a more accurate measurement.

18 Claims, 4 Drawing Sheets

(51) Int. Cl.
　　　*H02M 1/44*　　　(2007.01)
　　　*H03H 7/01*　　　(2006.01)
　　　*H04L 12/10*　　　(2006.01)
　　　*H04L 12/40*　　　(2006.01)
　　　*H04L 25/02*　　　(2006.01)

(52) U.S. Cl.
　　　CPC ........... *H03H 7/0138* (2013.01); *H04L 12/10* (2013.01); *H04L 12/40045* (2013.01); *H04L 25/0272* (2013.01); *H04L 25/0298* (2013.01)

(58) Field of Classification Search
　　　USPC ..................................... 333/1, 4, 5, 175, 185
　　　See application file for complete search history.

(56) References Cited

U.S. PATENT DOCUMENTS

| | | |
|---|---|---|
| 7,430,291 B2 * | 9/2008 | Washburn ........... H04L 25/0298 379/398 |
| 2011/0055598 A1 | 3/2011 | Yu |
| 2015/0145324 A1 | 5/2015 | Heath et al. |
| 2015/0215131 A1 | 7/2015 | Paul et al. |
| 2016/0054777 A1 | 2/2016 | Dwelley et al. |
| 2016/0301208 A1 | 10/2016 | Lin et al. |
| 2016/0308683 A1 | 10/2016 | Pischl et al. |

OTHER PUBLICATIONS

PCT/US2017/042893, EPO as ISA "International Search Report and Written Opinion", 12 pages. dated Sep. 29, 2017.

\* cited by examiner

COMMUNICATIONS SYSTEM USING HYBRID COMMON MODE CHOKE AND KELVIN SENSING OF VOLTAGE

CROSS-REFERENCE TO RELATED APPLICATIONS

This application is based on and claims priority from U.S. Provisional Application Ser. No. 62/366,308, filed Jul. 25, 2016, by Andrew J. Gardner, and is also based on and claims priority from U.S. Provisional Application Ser. No. 62/458,522, filed Feb. 13, 2017, by Andrew J. Gardner, both applications incorporated herein by reference.

FIELD OF THE INVENTION

One invention relates to communication systems using differential data over a twisted wire pair and, in particular, to techniques for improving the common mode and differential mode loss characteristics. Another invention relates to Power Over Data Lines (PoDL) systems, where power from a Power Sourcing Equipment (PSE) is transmitted to a Powered Device (PD) over a single wire pair that also used for conducting differential data signals, typically Ethernet signals, and enabling a more accurate measurement of voltage in the system.

BACKGROUND

It is known to transmit power over data lines to power remote equipment. In this way, the need for providing any external power source for the Powered Devices (PDs) can be eliminated. One form of this technology is Power Over Data Lines (PoDL) where power is transmitted over a single, twisted wire pair along with the differential data. PoDL is likely to become a popular technique, especially in automobiles.

FIG. 1 illustrates a known configuration of a PoDL system copied from US 2016/0308683. A media dependent interface (MDI) connector 160 is coupled to a twisted wire pair (not shown) carrying both differential data and a DC voltage. The coupling for both ends of the PoDL system may be identical.

A PHY 150 outputs differential data and receives differential data via the MDI connector 160, a common mode choke (CMC) 210, and AC coupling capacitors C1 and C2. PHY 150 represents the physical layer in the OSI model and is a transceiver that typically includes signal conditioning and decoding circuitry for presenting bits to the next stage. The term PHY is a term of art and is defined by various IEEE standards, depending on the particular application. The PHY is typically an integrated circuit. A digital processor (not shown) is coupled to the PHY 150 for processing the data.

If the circuit of FIG. 1 is on the PSE side, DC voltage from a power source 140 is coupled to the wires by separate inductors 142. The inductors 142 block AC and pass DC.

The wires from the MDI connector 160 are terminated by resistors R1 and R2 and capacitors C3 and C4 to minimize reflections.

FIG. 2 illustrates another prior art circuit where differential data is transmitted through a twisted wire pair 12, and common mode noise is filtered out by the CMC1 and CMC2. Since no DC voltage is conducted, AC coupling capacitors may not be needed.

A CMC is an in-line transformer with two windings in series with the twisted wire pair. As shown by the dots on the CMC windings, the windings have the same polarity, so the magnetic field generated by a differential mode signal is substantially cancelled out. Thus, the CMC presents little inductance or impedance to differential-mode currents. Common-mode currents, however, see a high impedance due to the combined inductance of the windings.

In both configurations, the CMCs ideally eliminate or greatly attenuate common mode RF noise while providing no loss for the differential or DC voltage signals. However, CMCs have constraints which impede their ideal performance. Such constraints include inter-winding capacitance, DC resistance (DCR) of the windings, and core loss. The CMCs must also present to the differential data a low insertion loss and a high return loss.

Some applications need to achieve very low bit error rates in a noisy environment, such as in a factory. Conventional CMCs alone cannot accomplish this without increasing the differential data insertion loss. The user can replace the unshielded twisted wire pair (typically an Ethernet CAT-5 cable) with a shielded cable, but this adds significant expense.

What is needed is a termination technique for differential data communications that provides a more robust technique for filtering out common mode noise.

Additionally, in some PoDL applications, the user requires to know the actual voltage at certain nodes in the system. In some applications, the voltage at the MDI connector is specified. However, this voltage cannot be measured downstream of the CMCs due to the direct current resistance (DCR) of the windings, where variations in DC current vary the losses through the windings. It is not desirable to add more connections to the MDI (possibly carrying a high PoDL current) since this may result in additional parasitic capacitance loading. It would be better to detect the MDI voltage at the PD or PSE without any connection directly at the MDI. What is needed is a technique to accurately detect the MDI voltage at the PSE or PD.

SUMMARY

Two inventions are disclosed herein. One invention is a termination technique for differential data twisted wire pairs that increases the rejection of AC common mode RF noise on the twisted pair. The other invention is a technique for accurately measuring the DC voltage transmitted on a twisted wire pair in a PoDL system.

A hybrid common mode choke (HCMC) is disclosed that has three ports, where each port consists of two terminals. A first port is coupled to a PHY. The second port is a first end of a common mode choke (CMC), where the windings have the same polarity (dots on the same ends). The third port is a first end of a differential mode choke (DMC) having windings with opposite polarities (dots on opposite ends). The second ends of the CMC and DMC are coupled to the first port. The third port is coupled to a suitable termination for AC common mode noise. The HCMC may be a single module.

The CMC has a large common mode impedance and a low differential mode impedance between its two ports. The transmission of an AC common mode signal between the first and second ports is substantially impeded by the CMC, while the transmission of a differential mode signal is not substantially impeded by the CMC. Conversely, the transmission of an AC common mode signal through the DMC to the third port is not substantially impeded by the DMC, while the transmission of an AC differential mode signal is substantially impeded by the DMC. Therefore, the DMC only passes the unwanted AC common mode noise signal to the third port that has already passed through the CMC.

Therefore, the CMC substantially blocks AC common mode noise and the DMC removes any remaining AC common mode noise (diverts the AC common mode noise to the third port).

Since the DMC improves the AC common mode rejection, the CMC windings can have a lower inductance value, reducing the DCR of the CMC windings and improving the overall efficiency of the system by increasing the differential mode return loss of the CMC. Alternatively, the CMC inductance can stay the same and the overall AC common mode rejection may be increased by the shunting action of the DMC.

This allows the use of a conventional twisted wire pair (e.g., a CAT-5 cable) in a noisy environment rather than a more expensive shielded cable.

The third port can be connected to a suitable termination for the AC common mode RF noise in order to reduce reflections, such as ground (if no DC is being conducted by the twisted wire pair) or to capacitors connected to ground, or the third port terminals can be tied together and connected to a single capacitor to ground.

The hybrid CMC substantially improves upon the prior art common mode insertion loss (i.e., reduces common mode noise) while achieving high differential mode return loss and low differential mode insertion loss.

A technique for accurately measuring the DC voltage at the twisted wire pair in a PoDL system is also disclosed. In conventional systems, the voltage from the PSE is detected at the output of the PSE, but high DC currents create voltage drops, such as across the CMC where the windings have a direct current resistance (DCR). So the measured voltage is higher than the voltage actually being applied at the ends of the twisted wire pair.

In a PoDL application, the second port of the HCMC is coupled to a conventional media dependent interface (MDI) connector, which is coupled to a twisted wire pair. To accurately measure the voltage applied to the twisted wire pair, it is sometimes impractical to connect additional wires at the MDI connector and measure the voltage directly at the MDI connector. A solution is to provide AC-coupled termination resistors at the inputs of the MDI connector and measure the voltage between the resistors and their associated capacitors. The AC-coupled termination resistors to ground reduce signal reflections, and substantially no DC current is conducted due to the AC coupling to ground. Therefore, there is no voltage drop across the resistors. Thus, the voltage sensing uses highly accurate Kelvin sensing, since the sensing is not performed on conductors carrying DC current. Kelvin sensing refers to the voltage detection being done on very low current-carrying wires rather than on high current wires. The voltage sensing may be performed by a conventional voltage sensor in the PSE or PD.

BRIEF DESCRIPTION OF THE DRAWINGS

Elements in the various figures that are the same or equivalent are labeled with the same numeral.

DETAILED DESCRIPTION

Figure 3:
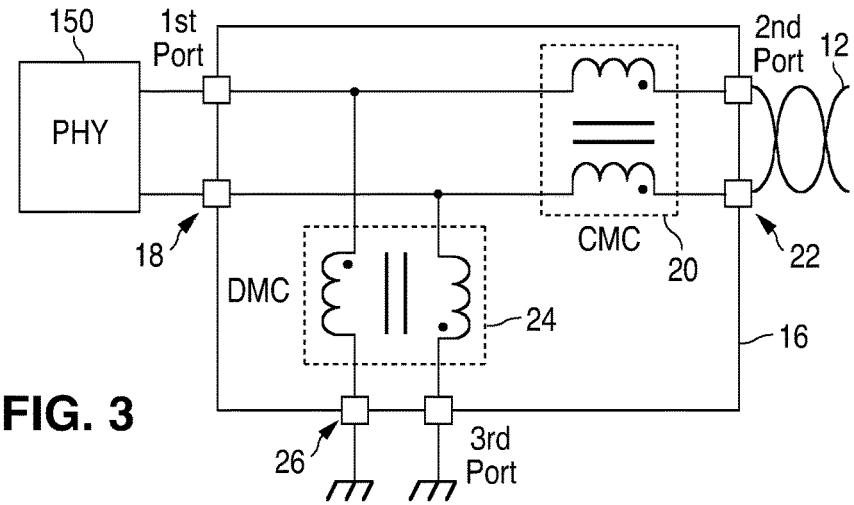
FIG. 3 illustrates a hybrid CMC being used to terminate the wires by coupling the DMC terminals (third port) to ground to improve AC common mode insertion loss.

FIG. 3 illustrates the use of a hybrid common mode choke (HCMC) 16. The HCMC 16 has three ports, where each port consists of two terminals. The first port 18 is a first end of a CMC 20, and a second 22 port is the other end of the CMC 20. If the HCMC 16 is incorporated in a PoDL system, AC coupling capacitors may be coupled between the first port 18 and the PHY 150 (a transceiver). A twisted wire pair 12, for carrying differential data, may be coupled to the second port 22. An MDI connector may be used to connect between the second port 22 and the twisted wire pair 12. The two windings of the CMC 20 have the same polarity (dots are at the second port end), so the CMC 20 impedes (greatly attenuates) common mode noise signals. The first end of the CMC 20 is also coupled to a differential mode choke (DMC) 24 which is a transformer with windings having opposite polarities (dots on opposite ends). The other end of the DMC 24 is the third port 26. The third port 26 may be coupled to a suitable AC termination to minimize reflections.

The DMC 24 blocks AC differential signals generated by the PHY 150 and from the wire pair 12, due to the opposite polarities of the windings.

The HCMC 16 substantially reduces common mode noise on the wire pair 12 while achieving a high differential mode return loss (damps reflections) and low differential mode insertion loss.

Figure 1:
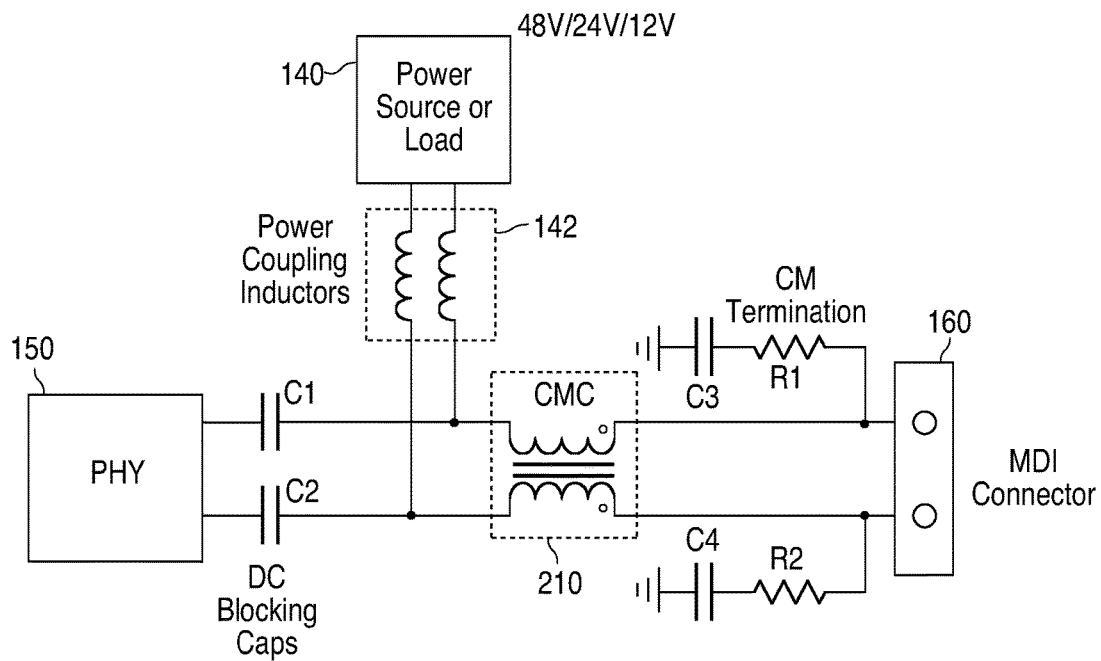
FIG. 1 illustrates one end of a conventional PoDL system that enables Ethernet communication and power transmission over a single pair of wires. The other end is identical except for the PSE or PD.
Figure 2:
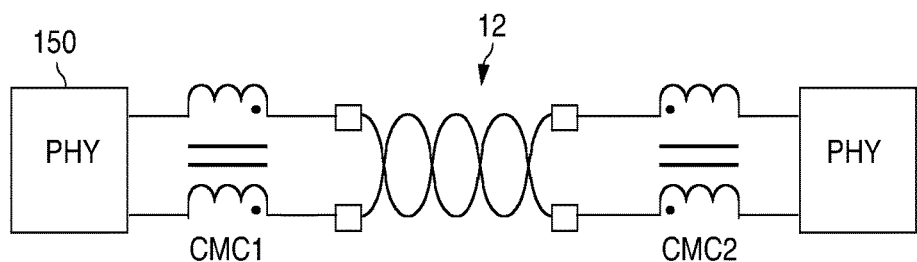
FIG. 2 illustrates CMCs between a PHY and a twisted wire pair, carrying differential data signals, for filtering out common mode noise.

The CMC 20 has a large common mode impedance due to its windings having the same polarity, so common mode noise on the wire pair 12 is blocked. The CMC 20 has a low differential mode impedance between its two ports due to its windings having the same polarity, so differential data passes freely. The CMC 20 also freely passes any DC voltage from a PSE voltage source in a PoDL system. If a PoDL system is used, the DC voltage may be connected to the twisted wire pair 12 using the inductors 142 in FIG. 1, or the DC voltage may be connected to the third port 26, where the power supply absorbs the AC common mode noise that passes through the DMC 24

Conversely, by action of the DMC 24, the transmission of an AC common mode signal between the CMC 20 and the third port 26 is not substantially impeded by the DMC 24 while the transmission of an AC differential mode signal is substantially impeded by the DMC 24. In this way, circuitry connected to the third port 26 can be used to substantially eliminate any AC common mode signals that have passed through the CMC 20. Such circuitry connected to the third port 26 may include ground, as shown in FIG. 3, assuming the system is not a PoDL system.

Figure 4:
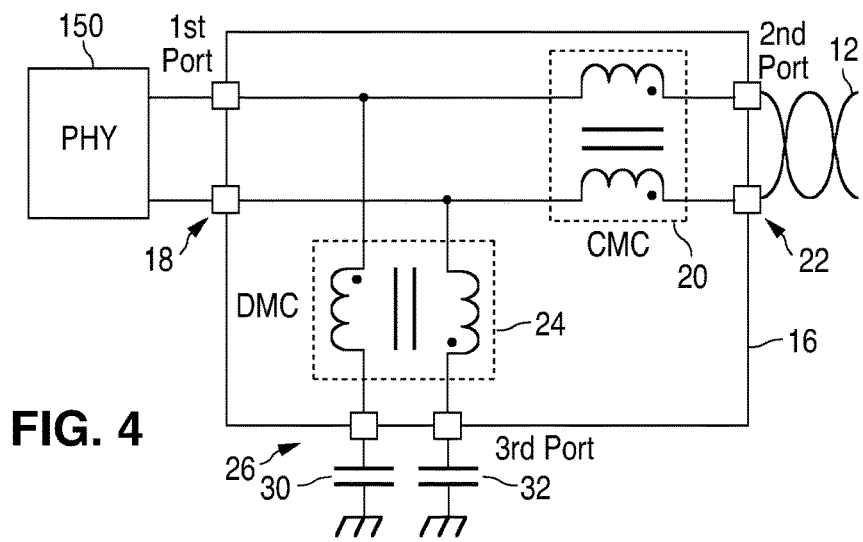
FIG. 4 illustrates the hybrid CMC being used to terminate the wires by coupling the DMC terminals (third port) to ground via AC coupling capacitors.
Figure 5:
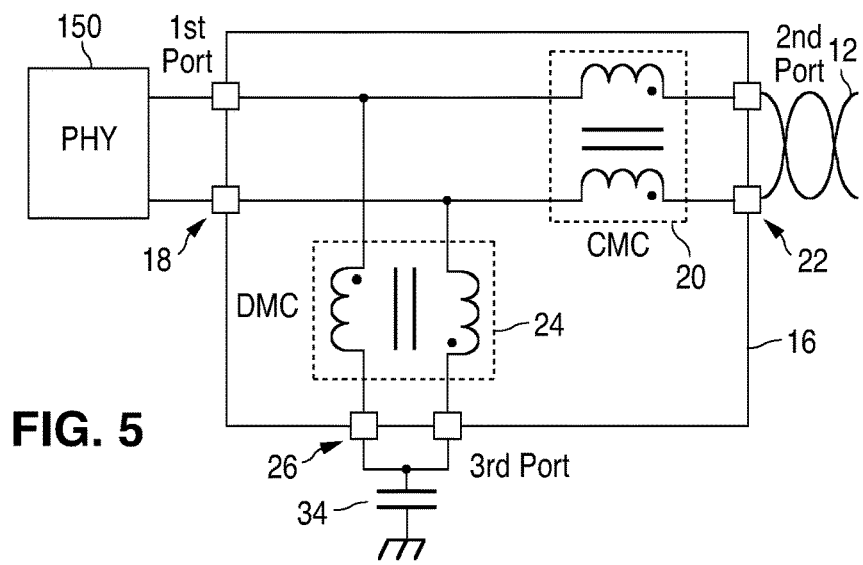
FIG. 5 illustrates the hybrid CMC being used to terminate the wires by coupling the DMC terminals (third port) together and then to ground via AC coupling capacitors.

Other circuitry coupled to the third port 28 to terminate the wires and eliminate the AC common mode signals are shown in FIGS. 4 and 5. FIG. 4 illustrates the third port 26 being connected to ground via AC coupling capacitors 30 and 32 to terminate the wires and eliminate the AC common mode signals. FIG. 5 illustrates the two terminals of the third port 26 being connected together and then to ground via an AC coupling capacitor 34 to terminate the wires and eliminate the AC common mode signals.

Since the DMC 24 improves the AC common mode rejection, the CMC 20 windings can have a lower inductance value, resulting in a lowering of the DCR of the CMC 20 and improving the overall efficiency of the system. Core loss is also reduced. This also allows the use of a conventional twisted wire pair 12 (e.g., a CAT-5 cable) in a noisy environment rather than a more expensive shielded cable.

A technique for accurately measuring the voltage at the twisted wire pair will now be described with reference to FIGS. 6-8. In conventional systems, the DC voltage from the PSE is detected at the output of the PSE, but high DC currents create voltage drops, such as across the CMC where the windings have a direct current resistance (DCR). So the measured voltage is higher than the voltage actually being applied at the ends of the twisted wire pair. Some applications require the accurate measurement of the voltage applied to the twisted wire pair.

Figure 6:
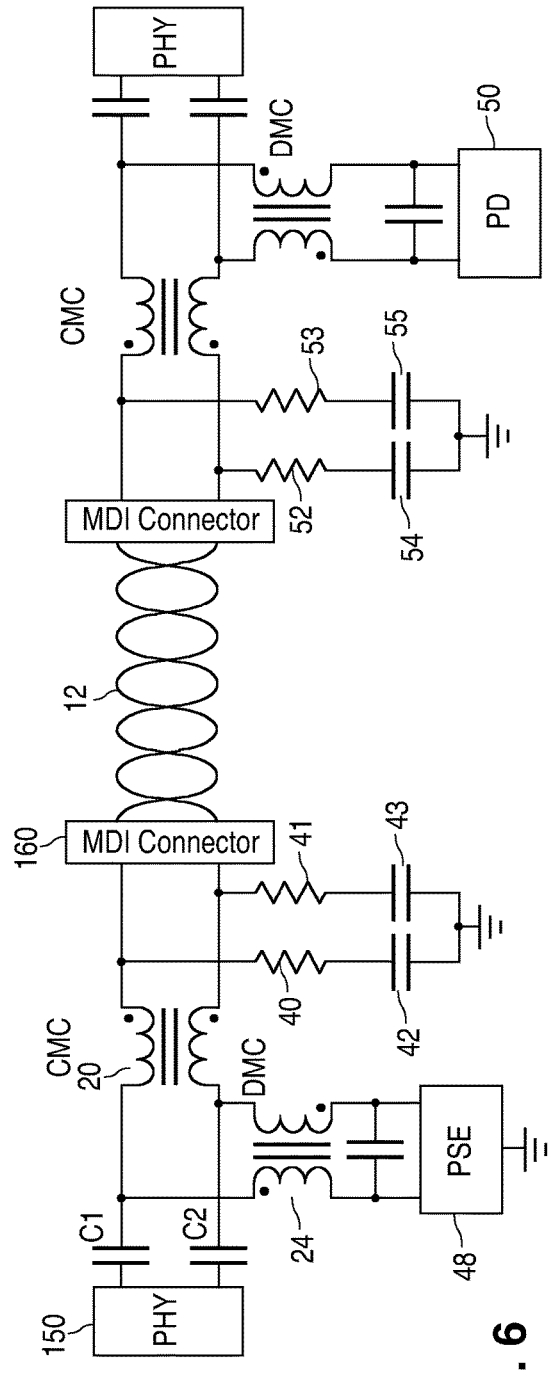
FIG. 6 illustrates the hybrid CMC in a PoDL system where the wires are terminated by resistors and AC coupling capacitors between the MDI connector and the CMC.

FIG. 6 illustrates a PoDL system where AC-coupled termination resistors 40 and 41 are coupled to the terminals of the MDI connector 160 to eliminate reflections on the twisted wire pair 12. A PSE 48 provides a DC voltage on the twisted pair via the DMC 24. No DC voltage flows through the resistors 40 and 41 due to the capacitors 42 and 43 blocking DC. Therefore, there is no DC voltage drop across the resistors 40 and 41.

In cases where the DC voltage at the MDI connector 160 is required to be measured, to accurately measure the voltage applied to the twisted wire pair 12, it is sometimes impractical to connect additional wires at the MDI connector 160 (possibly carrying a high current) and measure the voltage directly at the MDI connector 160.

Figure 7:
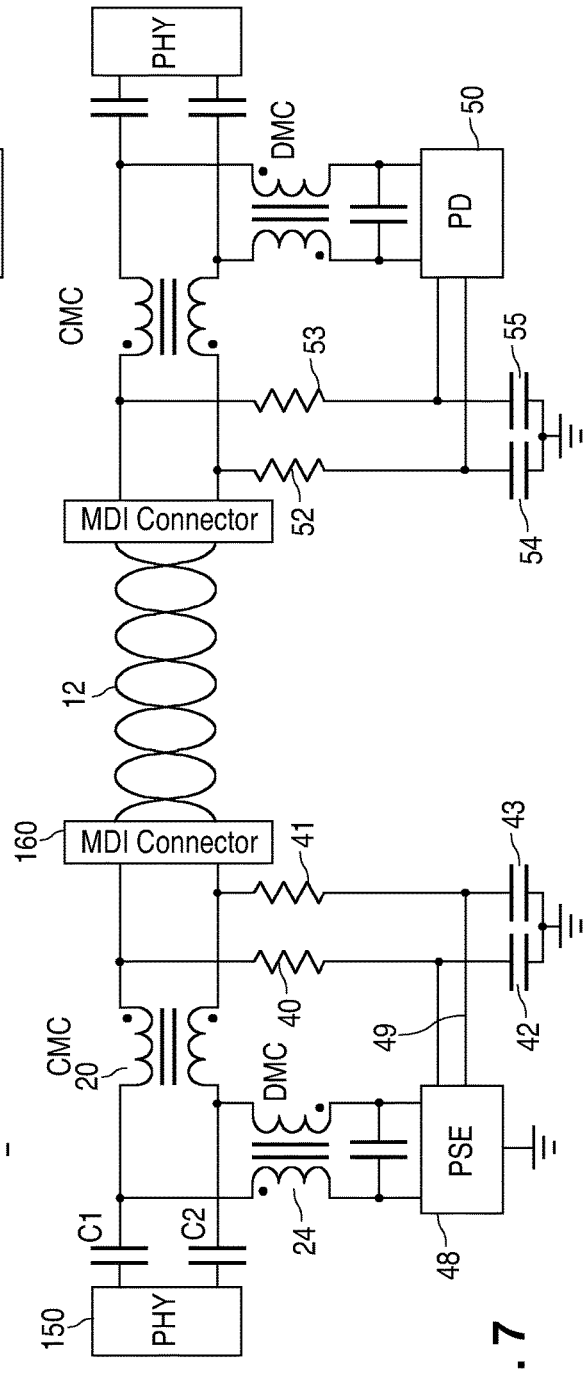
FIG. 7 illustrates a technique applied to the circuit of FIG. 7 for accurately measuring the DC voltage at the MDI connector.

As shown in FIG. 7, conductors 49 are connected at the nodes between the resistors 40 and 41 and their associated capacitors 42 and 43. The conductors 49 lead to a conventional DC voltage sensing device within the PSE 48. The voltage sensing device may generate an analog or digital signal identifying the voltage, or the sensed voltage is otherwise used for determining proper operation of the system. In one embodiment, the voltage sensing device is an analog-to-digital converter that generates a digital signal corresponding to the analog voltage.

Thus, the voltage sensing uses highly accurate Kelvin sensing, since the sensing is not performed on conductors carrying DC current. Kelvin sensing refers to the voltage detection being done on very low current-carrying wires rather than on high current wires.

The same Kelvin sensing is done on the PD side, shown in FIG. 7, where the PD 50 contains the DC voltage sensing device, such as for determining if the system meets certain requirements. The DC voltage is tapped off AC-coupled resistors 52 and 53, connected to ground via capacitors 54 and 55, using conductors 56.

Accordingly, the voltage in and out of the twisted wire pair 12 is accurately measured in the PSE or PD using Kelvin sensing at the MDI connector terminals.

The capacitors across the DC voltage terminals of the PSE 48 and PD 50 smooth the DC voltage.

Figure 8:
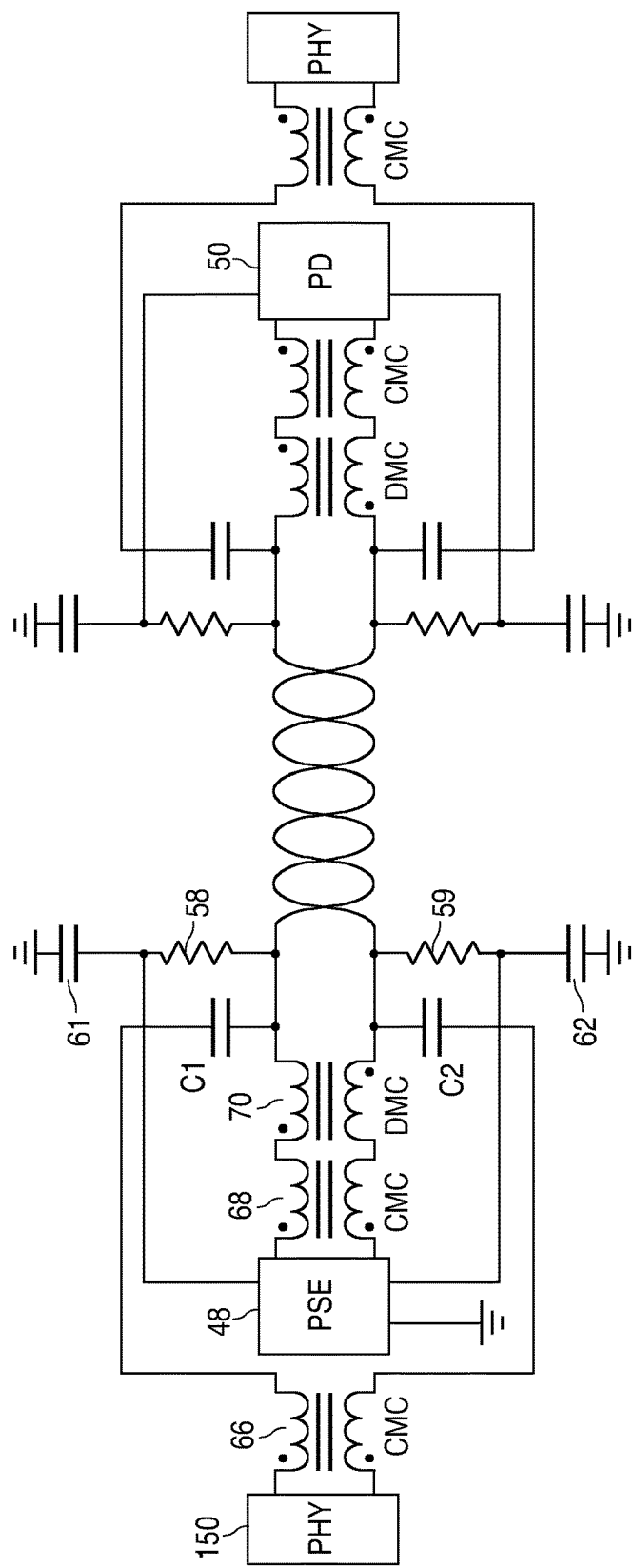
FIG. 8 illustrates another technique for accurately measuring the DC voltage as the MDI connector.

FIG. 8 illustrates another embodiment of the Kelvin sensing, where the DC voltage is tapped from the nodes of the AC-coupled resistors 58 and 59, connected to ground via capacitors 61 and 62. Since no DC current flows through the resistors 58 and 59, there is no voltage drop. Therefore, the DC voltage at the ends of the twisted wire pair 12 is accurately measured.

In FIG. 8, the AC coupling capacitors C1 and C2 couple the AC differential data to the PHY 150, and the CMC 66 at the input of the PHY 150 removes AC common mode noise signals.

The PSE 48 provides DC voltage to the twisted wire pair 12 via a CMC 68 and a DMC 70. Both allow DC voltage to pass, while AC voltage is blocked. An identical configuration is provided on the PD side for measuring voltage at the twisted wire pair 12.

While particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. A system for filtering AC common mode signals from a pair of wires carrying differential data comprising:
   a first port having two first terminals coupled to a transceiver that receives the differential data;
   a second port having two second terminals coupled to the pair of wires;
   a third port having two third terminals connected to AC termination circuitry;
   a common mode choke (CMC) coupled between the second port and the first port, the CMC comprising a first transformer with two windings having the same polarity; and
   a differential mode choke (DMC) coupled between the first port and the third port, the DMC comprising a second transformer with two windings having opposite polarities,
   wherein the CMC attenuates the AC common mode signals on the pair of wires and substantially passes the differential data, and
   wherein the DMC substantially passes the AC common mode signals that pass through the CMC from the pair of wires and applies the AC common mode signals to the termination circuitry to further attenuate the AC common mode signals prior to being received by the transceiver.

2. The system of claim 1 wherein the AC termination circuitry comprises a first capacitor coupled between one of the third terminals and a reference voltage, and a second capacitor coupled between another of the third terminals and the reference voltage.

3. The system of claim 1 wherein the transceiver comprises a PHY coupled to the first port via AC-coupling circuitry.

4. The system of claim 1 wherein the AC termination circuitry comprises the two third terminals connected to a reference voltage.

5. A system for filtering AC common mode signals from a pair of wires carrying differential data comprising:
   a first port having two first terminals coupled to a transceiver that receives the differential data;
   a second port having two second terminals coupled to the pair of wires;

a third port having two third terminals connected to AC termination circuitry;
a DC voltage source coupled to the pair of wires via a DC-coupling circuit, wherein the DC voltage source also acts as the AC termination circuitry;
a common mode choke (CMC) coupled between the second port and the first port, the CMC comprising a first transformer with two windings having the same polarity; and
a differential mode choke (DMC) coupled between the first port and the third port, the DMC comprising a second transformer with two windings having opposite polarities,
wherein the CMC attenuates the AC common mode signals on the pair of wires and substantially passes the differential data, and
wherein the DMC substantially passes the AC common mode signals that pass through the CMC from the pair of wires and applies the AC common mode signals to the termination circuitry to further attenuate the AC common mode signals prior to being received by the transceiver.

6. The system of claim 5 where the DC-coupling circuit comprises one or more inductors.

7. The system of claim 5 wherein the DC coupling circuit comprises the DMC, and the DC voltage is coupled to the third port.

8. A system for filtering AC common mode signals from a pair of wires carrying differential data comprising:
a first port having two first terminals coupled to a transceiver that receives the differential data;
a second port having two second terminals coupled to the pair of wires;
a third port having two third terminals connected to AC termination circuitry;
a common mode choke (CMC) coupled between the second port and the first port, the CMC comprising a first transformer with two windings having the same polarity; and
a differential mode choke (DMC) coupled between the first port and the third port, the DMC comprising a second transformer with two windings having opposite polarities,
wherein the CMC attenuates the AC common mode signals on the pair of wires and substantially passes the differential data,
wherein the DMC substantially passes the AC common mode signals that pass through the CMC from the pair of wires and applies the AC common mode signals to the termination circuitry to further attenuate the AC common mode signals prior to being received by the transceiver, and
wherein the AC termination circuitry comprises a first capacitor coupled between the two third terminals and a reference voltage.

9. A system for filtering AC common mode signals from a pair of wires carrying differential data comprising:
a first port having two first terminals coupled to a transceiver that receives the differential data;
a second port having two second terminals coupled to the pair of wires;
a third port having two third terminals connected to AC termination circuitry;
a common mode choke (CMC) coupled between the second port and the first port, the CMC comprising a first transformer with two windings having the same polarity; and
a differential mode choke (DMC) coupled between the first port and the third port, the DMC comprising a second transformer with two windings having opposite polarities,
wherein the CMC attenuates the AC common mode signals on the pair of wires and substantially passes the differential data,
wherein the DMC substantially passes the AC common mode signals that pass through the CMC from the pair of wires and applies the AC common mode signals to the termination circuitry to further attenuate the AC common mode signals prior to being received by the transceiver,
wherein the transceiver comprises a PHY coupled to the first port via AC-coupling circuitry, and
wherein the AC-coupling circuitry comprises capacitors in series with the two first terminals and the PHY.

10. A system configured for filtering AC common mode signals from a pair of wires carrying differential data comprising:
a first port having two first terminals coupled to a transceiver configured for receiving the differential data;
a second port having two second terminals configured to be coupled to the pair of wires;
a third port having two third terminals configured for being connected to AC termination circuitry;
a common mode choke (CMC) coupled between the second port and the first port, the CMC comprising a first transformer with two windings having the same polarity; and
a differential mode choke (DMC) coupled between the first port and the third port, the DMC comprising a second transformer with two windings having opposite polarities,
wherein the CMC attenuates the AC common mode signals on the pair of wires and substantially passes the differential data, and
wherein the DMC substantially passes the AC common mode signals that pass through the CMC from the pair of wires and applies the AC common mode signals to the termination circuitry to further attenuate the AC common mode signals prior to being received by the transceiver.

11. The system of claim 10 wherein the AC termination circuitry comprises a first capacitor coupled between one of the third terminals and a reference voltage, and a second capacitor coupled between another of the third terminals and the reference voltage.

12. The system of claim 10 wherein the AC termination circuitry comprises a first capacitor coupled between the two third terminals and a reference voltage.

13. The system of claim 10 wherein the AC termination circuitry comprises the two third terminals connected to a reference voltage.

14. The system of claim 10 further comprising a DC voltage source coupled to the pair of wires via a DC-coupling circuit, wherein the DC voltage source also acts as the AC termination circuitry.

15. The system of claim 14 where the DC-coupling circuit comprises one or more inductors.

16. The system of claim 14 wherein the DC coupling circuit comprises the DMC, and the DC voltage is coupled to the third port.

17. The system of claim 10 wherein the transceiver comprises a PHY coupled to the first port via AC-coupling circuitry.

18. The system of claim 17 wherein the AC-coupling circuitry comprises capacitors in series with the two first terminals and the PHY.

\* \* \* \* \*